United States Patent
Donofrio et al.

(10) Patent No.: US 9,444,024 B2
(45) Date of Patent: Sep. 13, 2016

(54) METHODS OF FORMING OPTICAL CONVERSION MATERIAL CAPS

(75) Inventors: Matthew Donofrio, Raleigh, NC (US);
John Edmond, Durham, NC (US);
Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 41 days.

(21) Appl. No.: 13/293,475

(22) Filed: Nov. 10, 2011

(65) Prior Publication Data
US 2013/0119418 A1    May 16, 2013

(51) Int. Cl.
| H01L 21/00 | (2006.01) |
| H01L 33/00 | (2010.01) |
| H01L 33/50 | (2010.01) |
| B29D 11/00 | (2006.01) |
| H01L 33/20 | (2010.01) |

(52) U.S. Cl.
CPC ....... *H01L 33/505* (2013.01); *B29D 11/00894* (2013.01); *H01L 33/20* (2013.01); *H01L 33/504* (2013.01); *H01L 2933/0041* (2013.01)

(58) Field of Classification Search
CPC .............................. H01L 33/508; H01L 33/20
USPC ................... 438/26–30, 22, 33; 257/98–102, 257/E33.056–E33.059
See application file for complete search history.

(56) References Cited

U.S. PATENT DOCUMENTS

| 6,627,125 | B1* | 9/2003 | Nishikawa ............ B29C 39/023 264/1.38 |
| 7,326,583 | B2* | 2/2008 | Andrews et al. ................ 438/26 |
| 2006/0170332 | A1* | 8/2006 | Tamaki et al. ................. 313/498 |
| 2006/0204901 | A1* | 9/2006 | Shimizu ........... B29D 11/00278 430/321 |
| 2010/0155763 | A1* | 6/2010 | Donofrio et al. ............... 257/98 |
| 2010/0181582 | A1* | 7/2010 | Li et al. .......................... 257/91 |
| 2011/0031516 | A1* | 2/2011 | Basin et al. ..................... 257/98 |
| 2011/0205740 | A1* | 8/2011 | Rindt ...................... C03B 11/08 362/293 |
| 2012/0032217 | A1* | 2/2012 | Yen ................................ 257/98 |
| 2012/0037951 | A1* | 2/2012 | Terada ................... B29C 39/10 257/100 |

FOREIGN PATENT DOCUMENTS

EP        0745565    * 5/1996 ............. C03B 13/14

* cited by examiner

*Primary Examiner* — Calvin Lee
(74) *Attorney, Agent, or Firm* — Myers Bigel & Sibley, P.A.

(57) ABSTRACT

A method of forming can be provided by applying an optical conversion material to a mold to form a unitary layer of optical conversion material and removing the unitary layer of optical conversion material from the mold.

37 Claims, 8 Drawing Sheets

METHODS OF FORMING OPTICAL CONVERSION MATERIAL CAPS

BACKGROUND

This invention relates to methods of forming optical conversion layers for semiconductor light emitting devices and devices so formed.

Light emitting diodes (LEDs), a particular type of light emitting device, are semiconductor devices that convert electric energy to light. Inorganic LEDs typically include an active layer of semiconductor material and a P-N junction formed at an interface between two oppositely doped layers. When a bias is applied across the P-N junction, holes and/or electrons are injected by the P-N junction into the active layer. Recombination of holes and electrons in the active layer generates light that can be emitted from the LED. The structure of the device, and the material from which it is constructed, can determine the intensity and wavelength of light emitted by the device.

Light from a blue emitting LED has been converted to white light by surrounding the LED with a yellow phosphor, polymer or dye, such as cerium-doped yttrium aluminum garnet (Ce:YAG). The phosphor material can absorb and "downconvert" some of the blue light generated by the LED. That is, the phosphor material generates light, such as yellow light, in response to absorbing the blue light. Thus, some of the blue light generated by the LED appears to be converted to yellow light. Some of the blue light from the LED, however, passes through the phosphor without being converted. The overall LED/phosphor structure can emit both blue and yellow light, which combine to provide light that may be perceived as white light.

LEDs have been combined with phosphor layers by dispensing a volume of phosphor-containing encapsulant material (e.g., epoxy resin or silicone) to cover the LED.

Another conventional method for coating an LED is by stencil printing. In a stencil printing approach, multiple LEDs are arranged on a substrate with a desired distance there between. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Another conventional method for coating LEDs with a phosphor utilizes electrophoretic deposition (EPD). The conversion material particles are suspended in an electrolyte based solution. A plurality of LEDs are immersed in the electrolyte solution. One electrode from a power source is coupled to the LEDs, and the other electrode is arranged in the electrolyte solution. The bias from the power source is applied across the electrodes, which causes current to pass through the solution to the LEDs. This creates an electric field that causes the conversion material to be drawn to the LEDs, covering the LEDs with the conversion material. After the LEDs are covered by the conversion material, they are removed from the electrolyte solution so that the LEDs and their conversion material can be covered by a protective resin.

Still another coating method for LEDs utilizes droplet deposition using systems similar to those in an ink-jet printing apparatus. Droplets of a liquid phosphor-containing material are sprayed from a print head. The phosphor-containing droplets are ejected from a nozzle on the print head in response to pressure generated in the print head by a thermal bubble and/or by piezoelectric crystal vibrations.

SUMMARY

In some embodiments according to the invention, a unitary layer of optical conversion material can be formed by applying the optical conversion material (such as a phosphor) to a mold. After formation, the unitary layer of optical conversion material can be removed from the mold as a single sheet of pre-formed optical conversion material caps that are to be mounted on light emitting device structures, which provides part of the light emitting devices. Using the mold to form the caps can reduce the amount of optical conversion material used. For example, the structures in the mold can approximate the profile of the light emitting structures on which the caps are to be mounted.

The structures in the mold can be formed at a higher density compared to the density of the actual devices on an LED package substrate. For example, in some conventional approaches, a phosphor may be sprayed on the LED package substrate that includes devices to be packaged as LEDs. In such approaches, phosphor may be unnecessarily deposited on the LED package substrate between the devices, which result in wasted phosphor. In contrast, in some embodiments according to the invention, the mold includes structures formed at a relatively high density. Therefore, the spacing between the structures in the mold can be relatively small compared to the spacing between devices on the LED package substrate, which can lead to less phosphor being applied outside the structures in the mold (i.e., less wasted phosphor).

In some embodiments according to the invention, a backing material (such as a clear silicone layer) can be applied to the optical conversion material when in the mold to provide the unitary layer of optical conversion material, which can later be removed from the mold (such as after the backing material and optical conversion material are cured).

In some embodiments according to the invention, the optical conversion material can be a single layer of optical conversion material having different elements (such as red and yellow phosphors) combined in the single layer. In other embodiments according to the invention, the optical conversion material may include different layers of different optical conversion materials, such as a first optical conversion material in a first layer and a second optical conversion material in a second layer. In still other embodiments according to the invention, combinations of different optical conversion materials can be combined in one or more single layers.

In still other embodiments according to the invention, the backing layer on the optical conversion material can have a complex shear modulus (G*) of about 12 MPA to about 16 MPA at about 25 degrees Centigrade, when the backing layer is cured, to adhere to the optical conversion material. Therefore, the unitary layer including the optical conversion material and the backing layer may be more readily removed from the mold given the mechanical stability provided by the backing layer.

In still other embodiments according to the invention, once the pre-formed optical conversion material caps are singulated that are separated from one another the singulated pre-formed optical conversion material caps can be "binned" based on the particular wavelength light produced when the cap is subjected to a particular wavelength light.

In some embodiments according to the invention, the pre-formed optical conversion material caps can be "binned"

before being separated from the unitary layer. For example, selected ones of the pre-formed optical conversion material caps in the unitary layer can be subjected to a particular wavelength light to determine an approximate wavelength light output for the entire unitary layer. Accordingly, the pre-formed optical conversional material caps can be separated from the unitary layer whereupon all of the singulated pre-formed optical conversion material caps can be placed in a single bin.

In some embodiments according to the invention, light emitting device can include a solid state light emitting device. A pre-formed optical conversion material cap can include a layer of optical conversion material that is mounted on the solid state light emitting device and a backing material layer that is separate from and on the layer of optical conversion material and located opposite the solid state light emitting device.

In some embodiments according to the invention, the layer of optical conversion material can be phosphor. In some embodiments according to the invention, the layer of optical conversion material can be a combination of different phosphors. In some embodiments according to the invention, the layer of optical conversion material can include a first layer of optical conversion material, on the solid state light emitting device, including a first phosphor. A second layer of optical conversion material can be on the first layer of optical conversion material opposite the solid state light emitting device and can include a second phosphor.

In some embodiments according to the invention, the backing material layer can be an optically clear silicone material. In some embodiments according to the invention, the backing material layer is bonded with the layer of optical conversion material. In some embodiments according to the invention, the layer of optical conversion material is in direct contact with a surface of the solid state light emitting device.

In some embodiments according to the invention, the solid state light emitting device includes lateral surfaces of solid state light emitting device wherein the layer of optical conversion material covers the lateral surfaces. In some embodiments according to the invention, the solid state light emitting device comprises a flip-chip solid state light emitting device free of wire bonding.

In some embodiments according to the invention, lateral surfaces of solid state light emitting device are entirely covered by the layer of optical conversion material. In some embodiments according to the invention, the layer of optical conversion material is in direct contact with a surface of the flip-chip solid state light emitting device.

DETAILED DESCRIPTION OF EMBODIMENTS ACCORDING TO THE INVENTION

Figure 1:
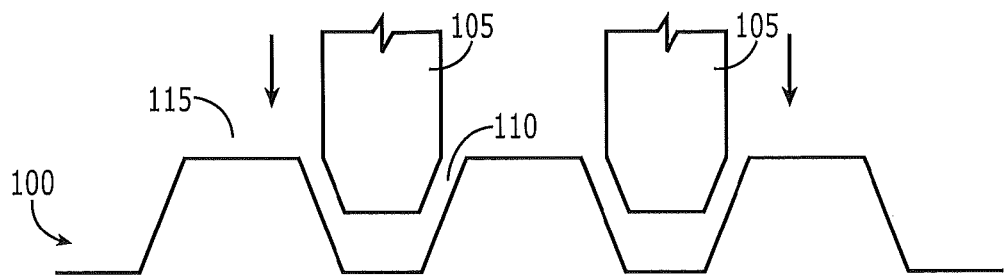
FIG. 1 is a schematic cross-sectional view of a mold used for the formation of a unitary layer of optical conversion material in some embodiments according to the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Various embodiments of the present invention for packaging a semiconductor light emitting device will be described herein. As used herein, the term semiconductor light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefore. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefore, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1. Furthermore, the present invention may be suitable for use with light emitting devices and methods therefore, such as those described in U.S. Pat. Nos. 7,326,583, 7,442,564, 7,521,728 and 7,646,035, the disclosures of which are incorporated by reference as if set forth fully herein.

As described herein in greater detail, in some embodiments according to the invention, a unitary layer of optical conversion material can be formed by applying the optical conversion material (such as a phosphor) to a mold. After formation, the unitary layer of optical conversion material can be removed from the mold as a single sheet of pre-formed optical conversion material caps that are to be mounted on light emitting device structures, which provides part of the light emitting devices. Using the mold to form the caps can reduce the amount of optical conversion material used, and moreover, the amount wasted. For example, the structures in the mold can approximate the profile of the light emitting structures on which the caps are to be mounted.

As appreciated by the present inventors, LED die are typically placed on package substrates on a pitch that is several times the size of the chip to allow sufficient room for lens forming and/or placement with the desired optical centering of the LED chips under the lens. In other conventional approaches, optical components can be made using "chip on board" technology, where few chips may be placed, at a very low density, on a comparatively large optical component. In such cases, spray coating the entire component may result in significant waste.

Accordingly, the structures in the mold can be formed at a higher density compared to the density of the actual devices on LED package substrate. For example, in some conventional approaches, a phosphor may be sprayed on the LED package substrate that includes devices to be packaged as LEDs. In such approaches, phosphor may be unnecessarily deposited on the LED package substrate between the devices, which result in wasted phosphor. In contrast, in some embodiments according to the invention, the mold includes structures formed at a relatively high density. Therefore, the spacing between the structures in the mold can be relatively small compared to the spacing between devices on the LED package substrate, which can lead to less phosphor being applied outside the structures in the mold (i.e., less wasted phosphor).

In some embodiments according to the invention, a backing material (such as a clear silicone layer) can be applied to the optical conversion material when in the mold to provide the unitary layer of optical conversion material, which can later be removed from the mold (such as after the backing material and optical conversion material are cured).

In some embodiments according to the invention, the optical conversion material can be a single layer of optical conversion material having different elements (such as red and yellow phosphors) combined in the single layer. In other embodiments according to the invention, the optical conversion material may include different layers of different optical conversion materials, such as a first optical conversion material in a first layer and a second optical conversion material in a second layer. In still other embodiments according to the invention, combinations of different optical conversion materials can be combined in one or more single layers.

In still other embodiments according to the invention, the backing layer on the optical conversion material can have has a complex shear modulus (G*) of about 12 MPA to about 16 MPA at about 25 degrees Centigrade, when the backing layer is cured, to promote adherence to the optical conversion material. Therefore, the unitary layer including the optical conversion material and the backing layer may be more readily removed from the mold given the mechanical stability provided by the backing layer.

In still other embodiments according to the invention, once the pre-formed optical conversion material caps are singulated that are separated from one another the singulated pre-formed optical conversion material caps can be "binned" based on the particular wavelength light produced when the cap is subjected to a particular wavelength light.

In some embodiments according to the invention, the pre-formed optical conversion material caps can be "binned" before being separated from the unitary layer. For example, selected ones of the pre-formed optical conversion material caps in the unitary layer can be subjected to a particular wavelength light to determine an approximate wavelength light output for the entire unitary layer. Accordingly, the pre-formed optical conversional material caps can be separated from the unitary layer whereupon all of the singulated pre-formed optical conversion material caps can be placed in a single bin.

FIG. 1 is a schematic cross-sectional view of a mold 100 including structures 115 protruding from a surface of the mold 100 and recesses 110 between the structures 115. The mold 100 can be any material suitable for the molding of an optical conversion material (i.e. such as phosphor) into a conformal or other profile layer. In some embodiments according to the invention, the mold 100 can be a metal, such as aluminum. In some embodiments according to the invention, the mold 100 can be Silicon or Silicon Carbide. Other materials can be used as the mold 100.

The structures 115 are spaced apart from one another at a first density within the mold 100. In some embodiments according to the invention, the structures 115 are spaced apart by about 100 microns. Other spacing may be used.

It will be further understood that the structures 115 have a profile that approximates the shape of light emitting structures upon which pre-formed optical conversion material caps are to be mounted. Any device profile can be accommodated by the structures 115. For example, in some embodiments according to the invention, the structures 115 can have a profile that approximates what is sometimes referred to as a two-topside contact horizontal or lateral LED. In some embodiments according to the invention, the structures 115 can have a profile that approximates the two-topside contact horizontal or lateral LED placed up-side down on a sub-mount. In some embodiments according to the invention, the structures 115 can have a profile that approximates what is sometimes referred to as a one-topside contact vertical LED. In some embodiments according to the invention, the structures 115 can have a profile that approximates what is sometimes referred to as a flip-chip LED configuration.

In some embodiments according to the invention, the mold 100 can be formed using a saw 105 brought into contact with the surface of the mold 100 to form the recesses 110. For example, as illustrated in FIG. 1 the saw 105 can cut into the surface of the mold to a depth that is about equal to the depth if the recesses 110. Accordingly, the formation of the recesses 110 by the saw 105 can also provide for the formation of the structures 115 at the first density to have the profile described herein.

It will be understood that the mold 100 can be formed according to any technique to provide the structures 115 and the recesses 110 at the densities described herein. For example, in some embodiments according to the invention, the mold 100 can be formed by stamping a solid material. In other embodiments according to the invention, the mold 100 may be extruded. Other techniques can be used to form the mold 100. It will also be understood that, although the profile of structures 115 are shown in the figures to have tapered sidewalls, the structures can have a shape that approximates the profile of the devices on which the pre-formed optical conversion material caps are to be mounted. In some embodiments according to the invention, the structures 115 have substantially vertical sidewalls. It will also be understood that the uppermost surfaces of the structures 115 can be non-planar to include features that approximate those included in devices on which the pre-formed optical conversion material caps are to be mounted.

Figure 2:
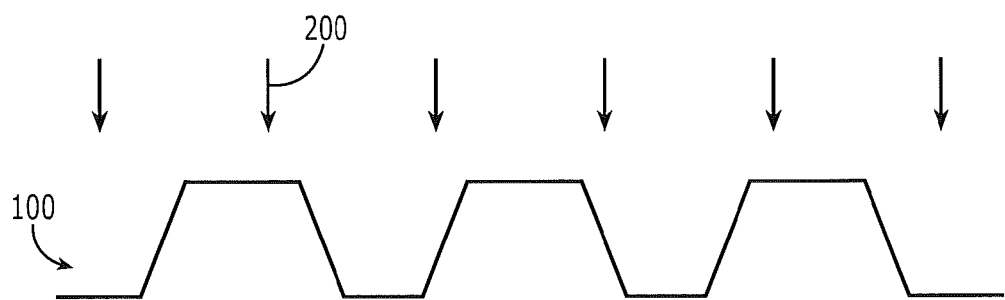
FIG. 2 is a schematic cross-sectional view of the mold having a release agent applied thereto in some embodiments according to the invention.

FIG. 2 is a schematic cross-sectional view of the mold 100 having a release material applied thereto. In particular, a release material 200 is sprayed, or otherwise applied onto a surface of the mold 100 from which the unitary layer is later removed. The release material 200 can be any material that will promote the removal of the unitary layer from the mold 100 while also maintaining the structural integrity and profile of the material removed from the mold 100. In some embodiments according to the invention, the release material 200 can be a silicone based release agent.

Figure 3:
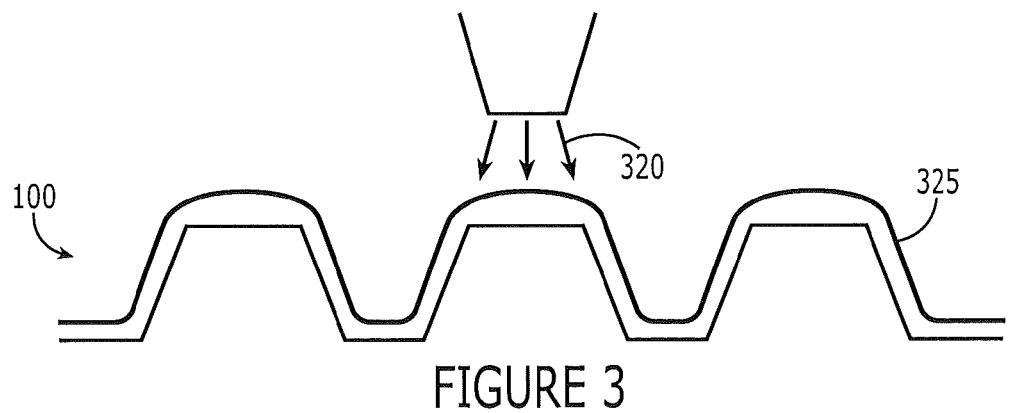
FIG. 3 is a schematic cross-sectional view of the mold having optical conversion material applied thereto as part of the unitary layer of optical conversion material in some embodiments according to the invention.

FIG. 3 is a schematic cross-sectional view of the mold 100 with the release material 200 thereon having an optical conversion material 320 applied to the mold 100. In some embodiments according to the invention, the optical conversion material 320 can be sprayed onto the mold 100 using an apparatus described in U.S. application Ser. No. 12/717,048, entitled "Phosphor Coating Systems and Methods for Light Emitting Structures and Packaged Light Emitting Diodes Including Phosphor Coating," filed on Mar. 3, 2010, the entire content of which is hereby incorporated herein by reference. In some embodiments according to the invention, the optical conversion material 320 includes a binder material, such as liquid silicone and/or liquid epoxy, and/or a volatile solvent material, such as alcohol, water, acetone, methanol, ethanol, ketone, isopropynol, hydrocarbon solvents, hexane, ethylene glycol, methyl ethyl ketone, and combinations thereof.

The optical conversion material 320 is applied to the mold 100 to form a layer of the optical conversion material 325 on the structures 115 and in the recesses 110. It will be understood that because the structures 115 are formed at a relatively high density compared to that used to fabricate devices on LED package substrates, less of the optical conversion material 320 is deposited in the recesses 110 than would be deposited on the LED package substrate between devices formed thereon. Accordingly, in some embodiments according to the invention, the amount of optical conversion material 320 included in the optical conversion material layer 325 can be relatively little compared to conventional approaches.

In some embodiments according to the invention, the optical conversion material layer 325 may be formed as a conformal layer on the structures 115 so that both the lateral sides as well as the upper sides of the structures 115 are coated with the optical conversion material 320. It will be further understood that the optical conversion material 320 included in the optical conversion material layer 325 can be a single optical conversion material or a combination of multiple optical conversion materials. For example, in some embodiments according to the invention the optical conversion material layer 325 includes a single type of phosphor (such as a red or blue). In other embodiments according to the invention, the optical conversion material 320 included in the optical conversion material layer 325 is a combination of different optical conversion materials (such as red and yellow phosphors combined).

Figure 4:
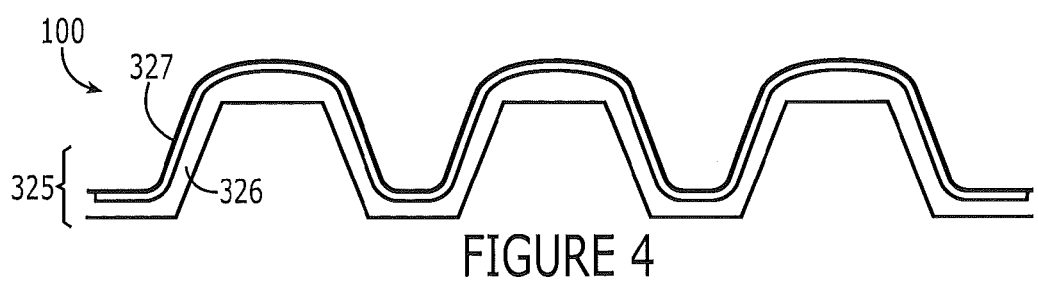
FIG. 4 is a schematic cross-sectional view of the application of a second optical conversion material on the optical conversion material shown in FIG. 3 to provide a second optical conversional material layer thereon as part of the unitary layer of optical conversion material in some embodiments according to the invention.

FIG. 4 is a schematic cross-sectional view of the mold 100 having an optical conversion material layer 325 that includes multiple optical conversion material layer 326 and 327 thereon. In particular, the optical conversion material layers 326 and 327 shown in FIG. 4 can be formed separately using the apparatus described in U.S. application Ser. No. 12/717,048, and referenced above. Moreover, the optical conversion material 320 in each of the single optical conversion material layers can be a single optical conversion material 320 or a combination of different optical conversion materials. It will be understood that separate optical conversion material layers 326 and 327 can be integrated with one another even though the layers are formed separately and may include different optical conversion materials. In some embodiments according to the invention, the optical conversion material 320 in the layers 326 and 327 includes a binder material as described herein.

Figure 5:
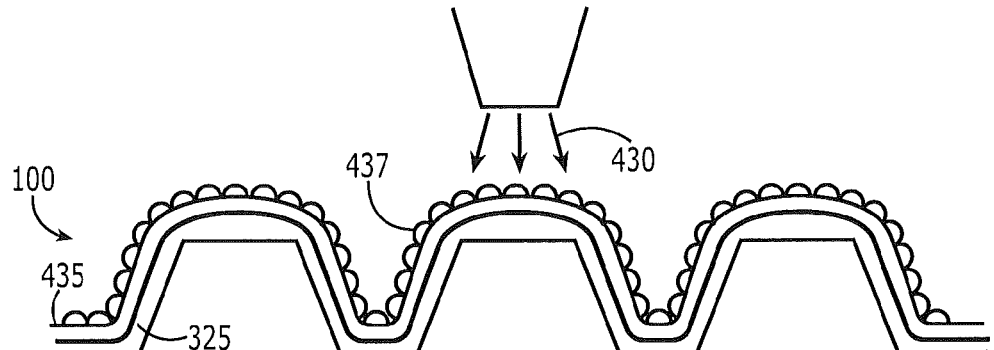
FIG. 5 is a schematic cross-sectional view of the mold having a backing material an optional layer of optical features applied to the optical conversion material to provide the unitary layer of optical conversion material in some embodiments according to the invention.

FIG. 5 is a schematic cross-sectional view of a backing material 430 applied to the optical conversion material layer 325 to form a backing layer 435 on the optical conversion material layer 325. In some embodiments according to the invention, the backing material 430 is an optically clear material, such as clear silicone, that adheres to the optical conversion material layer 325. The adhesion of the backing layer 435 to the optical conversion material layer 325 can be promoted by curing the backing material layer 435 on the optical conversion material layer 325 in the mold 100. The curing may promote the bonding of the backing material layer 435 with the underlying optical conversion material layer 325 so that the combined layers become a unitary layer of optical conversion material.

In some embodiments according to the invention, the backing material 430 can be applied to the optical conversion material layer 325 by any appropriate technique. In some embodiments according to the invention, the backing material 430 can be applied to the optical conversion material layer 325 by spraying the backing material 430 onto the optical conversion material layer 325. In some embodiments according to the invention, the backing material 430 can be provided as a film, which is pressed onto or otherwise adhered to the optical conversion material layer 325.

It will be understood that the curing can be provided by any technique, such as by the application of heat or light, or other radiation. In some embodiments according to the invention, the curing can be performed by heating the backing material layer 435 at a temperature of about 150 degrees Centigrade for about 1 hour. Other times and temperatures can be used to cure the backing material layer 435. For example, the backing material layer 435 can be cured at a temperature greater than 150 degrees Centigrade for a shorter time or at a temperature less than 150 degrees Centigrade, for a longer time.

It will be understood that, in some embodiments according to the invention, an upper surface of the backing layer 435 can include optical features 437, such as microlenses. The optical features 437 can, for example, focus or direct the emitted light in a particular direction or directions. In some embodiments according to the invention, the optical features 437 can include a diffusion material. In some embodiments according to the invention, the optical features 437 are stamped onto the upper surface of the backing layer 435. In some embodiments according to the invention, the optical features 437 are formed by roughening the upper surface of the backing layer 435. In some embodiments according to the invention, the optical features 437 provide the final air interface for the completed device.

In some embodiments according to the invention, the optical features 437 are already on the upper surface of the backing layer 435 when the backing layer 435 is applied to the underlying optical conversion material layer. In other words, the backing layer 435 may be provided as a pre-formed film having the optical features formed thereon. The backing layer 435 may, therefore, be pressed onto (or otherwise adhered to) the underlying optical conversion material layer.

In some embodiments according to the invention, the optical features 437 are provided across at least a majority of the entire upper surface of the backing layer 435. In some embodiments according to the invention, the optical features 437 are absent from portions of the upper surface of the backing layer 435, such as the portions located between the structures 115.

In some embodiments according to the invention, the optical features 437 including microlenses can be formed according to a constant parametric model or a variable parametric model. For example, in embodiments utilizing a variable parametric model, the optical features 437 may have different shapes and/or orientations at different portions of the upper surface of the backing layer 435. In some embodiments according to the invention, a lens which may normally be placed over a light emitting structure may be omitted when the optical features 437 are included in the backing layer 435.

In some embodiments according to the invention, the amount or concentration of the optical conversion material 325 used to provide the optical conversion layer can vary. For example, as appreciated by the present inventors, a higher concentration of phosphor may cause the optical conversion layer to be mechanically weaker than a similar thickness film formed of silicone only. Accordingly, in some embodiments according to the invention, the concentration of phosphor can be relatively high to improve the thermal properties of the optical conversion layer while keeping the optical conversion layer relatively thin, while the backing material layer 435 can provide improved mechanical stability for the combination. In some embodiments according to the invention, the concentration of the phosphor can be about 60 percent of the total weight used to form the optical conversion layer having a thickness of about 60 microns (e.g., about 1.5 grams of phosphor to about 1 gram of silicone).

In some embodiments according to the invention, the backing material 430 can be the same material used as the binder described herein. For example, the backing material 430 can be liquid silicone and/or liquid epoxy, and/or a volatile solvent material, such as alcohol, water, acetone, methanol, ethanol, ketone, isopropynol, hydrocarbon solvents, hexane, ethylene glycol, methyl ethyl ketone, and combinations thereof. In some embodiments according to the invention, the backing material 430 can be a material, such as silicone having a complex shear modulus (G*) of about 12 MPA to about 16 MPA at about 25 degrees Centigrade. In still other embodiments according to the invention, the backing material 430 can be selected from a group of materials that are compatible with silicones, which may have a complex shear modulus that is greater than or less than that described above.

Accordingly, it will be understood that the backing material 430 can have similar optical properties to those of the binder. For example, the backing material 430 and the binder can have respective indices of refraction, light transmission, and the like. Still further, in some embodiments according to the invention, the backing material 430 can have similar optical properties as those materials used to form a lens over the LED device and the pre-formed optical conversion material cap. In still other embodiments according to the invention, the backing material 430 can have similar optical properties as those materials used to attach a lens over the LED device and the pre-formed optical conversion material cap. In some embodiments according to the invention, the backing material 430 can include scattering particles that can add to the diffusive properties of the devices formed using the caps.

It will be understood that the term "unitary layer" includes two or more layers that adhere to one another to the point where the two or more layers can be manipulated as a single homogenous layer. In some embodiments according to the invention, the unitary layer results from the two layers chemically or covalently bonding to one another. The bonding of the two layers may provide the unitary layer with a mechanical resilience so that the two or more layers can be handled as one.

Figure 6:
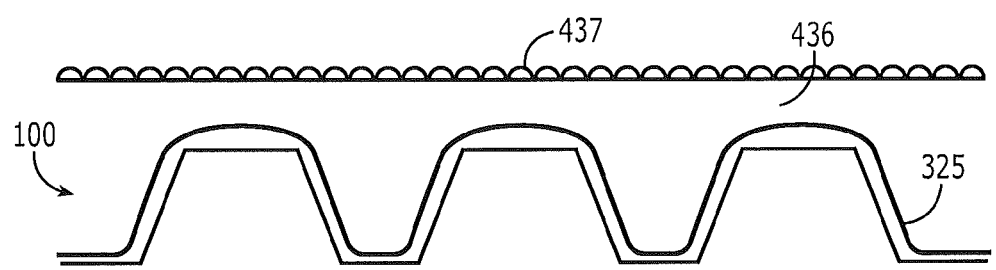
FIG. 6 is a schematic cross-sectional view showing the application of the backing material to the optical conversional material to provide the unitary layer of optical conversion material having a planar upper surface and an optional layer of optical features in some embodiments according to the invention.

FIG. 6 is a schematic cross-sectional view of a planarized backing layer 436 on the optical conversion material layer 325. In particular, the planarized backing layer 436 can be formed from the backing material 430 shown in FIG. 5, but is formed to provide a planar upper surface as shown in FIG. 6, rather than the conformal profile of the backing material layer 435 shown in FIG. 5.

It will be understood that, in some embodiments according to the invention, an upper surface of the planarized backing layer 436 can include the optical features 437, such as microlenses, and may have the same characteristics and be formed the same as those described above in reference to FIG. 5.

Although the unitary layer described in reference to FIGS. 4-6 includes both the backing material layer and the underlying optical conversion material layer, it will be understood that the unitary layer may be provided by the optical conversion material layer alone, when the optical conversion material layer provides both the optical conversion materials therein as well as the function of mechanical resilience described above in reference to the backing layer in FIGS. 4-6. For example, in some embodiments according to the invention, the optical conversion material layer may include a combination of optical conversion materials as well as other optically clear materials such that the optical conversion material layer has both features.

Figure 7:
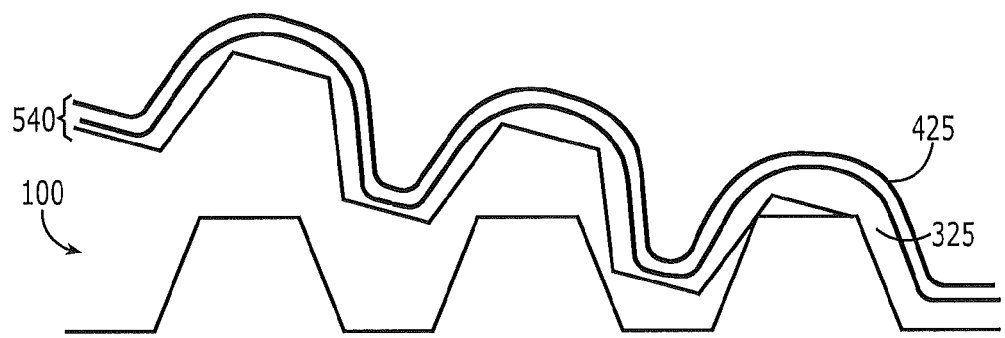
FIG. 7 is a schematic cross-sectional view of the unitary layer of optical conversion material being removed from the mold in some embodiments according to the invention.

FIG. 7 is a schematic cross-sectional view of the unitary layer 540 including the optical conversion material layer 325 and the backing material layer 425 being removed from the mold 100 as a single sheet. For example, in some embodiments according to the invention, the unitary layer 540 is peeled from the mold 100 where the release material 200 allows the removal of the unitary layer 540 without sticking to the surface of the mold 100. As described above, the mechanical resilience of the backing material layer 425 allows the unitary layer 540 to be removed for further processing. It will be further understood that the unitary layer 540 may be removed using other techniques. For example, in some embodiments according to the invention, the unitary layer 540 can be removed by a vacuum or by shaking the mold 100, or by use of compressed gas. In some embodiments according to the invention, the removal of the unitary layer 540 is promoted by heating the mold 100. Other techniques may also be used.

Figure 8:
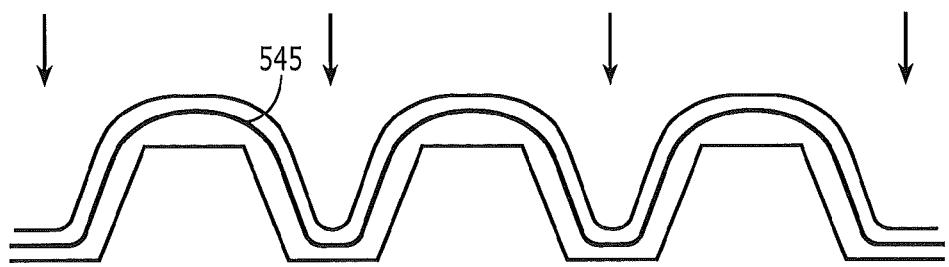
FIG. 8 is a schematic cross-sectional view of the unitary layer of optical conversion material being singulated after being removed from the mold in some embodiments according to the invention.

FIG. 8 is a schematic cross-sectional view of pre-formed optical conversion material caps included in the unitary layer 540 being separated from one another. In some embodiments according to the invention, the pre-formed optical conversion material caps 545 are separated from one another by cutting through the unitary layer 540 within the recessed areas so that the portions that are to be mounted on the light emitting structures are preserved. In some embodiments according to the invention, a feature may be included in the mold 100 between the structures 115 to promote the separation of the pre-formed optical conversion material caps 545 from one another once the unitary layer 540 is removed from the mold. Other techniques, such as laser cutting, etc. can be used to separate the pre-formed optical conversion material caps 545 from one another.

Figure 9:
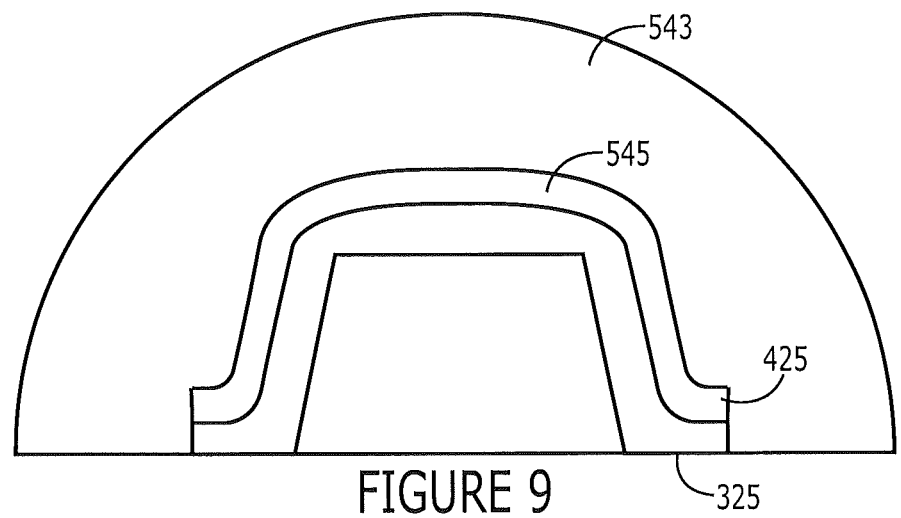
FIG. 9 is a schematic cross-sectional view of a singulated pre-formed optical conversion material cap separated from the unitary layer in some embodiments according to the invention.

FIG. 9 is a schematic cross-sectional view of the singulated pre-formed optical conversion material cap 545 separated from the unitary layer 540. According to FIG. 9, an interior region defined by the void within the cap approximates the profile of the light emitting structure upon which the cap 545 is to be mounted as part of the light emitting device. Accordingly, the interior lateral sidewalls and upper surface of the interior region may directly contact the light emitting surface of the light emitting structure upon which the cap 545 is mounted.

In some embodiments according to the present invention, a lens 543 can be placed on the cap 545. The lens 543 can be formed using different molding techniques such as those described in U.S. patent application Ser. No. 11/982,275, entitled Light Emitting Diode Package and Method for Fabricating Same. The lens 543 can be different shapes such as, hemispheric. Different materials can be used for the lens 543 such as silicone, plastic, epoxy or glass. In some embodiments according to the present invention, the lens can be a hollow glass lens. The lens 543 can also be textured to improve light extraction and/or scattering particles. In some embodiments according to the present invention, the lens 543 is placed onto the cap 545 prior to when the cap 545 is placed on the device. In other words, the cap 545 can include the lens 543, when placed on the device. In some embodiments according to the present invention, the lens 543 is placed onto the cap 545 after when the cap 545 is placed on the device.

Still referring to FIG. 9, in some embodiments according to the invention, interior region of the cap 545 defined by the void is sufficiently sized to accommodate a chip on any size base. For example, in some embodiments according to the invention, the void in the cap 545 will accommodate a base area of about 0.25 mm$^2$. In some embodiments according to the invention, the void in the cap 545 will accommodate a base area of about 0.5 mm$^2$ or greater. In some embodiments according to the invention, the void in the cap 545 will accommodate a base area of about 0.5 mm$^2$ or greater. In some embodiments according to the invention, the void in the cap 545 will accommodate a base area of about 1.0 mm$^2$ or greater. In some embodiments according to the invention, the void in the cap 545 will accommodate a base area of about 4.0 mm$^2$.

It will be understood that, in some embodiments according to the invention, the size of the void can be modified by changing the size of the structures 115 in the mold 100, as illustrated, for example in FIG. 1. For example, the width of the structures 115 can be increased to increase the corresponding width of the void shown in FIG. 9. Similarly, the width of the void can be reduced by decreasing the width of the structures 115.

Figure 10:
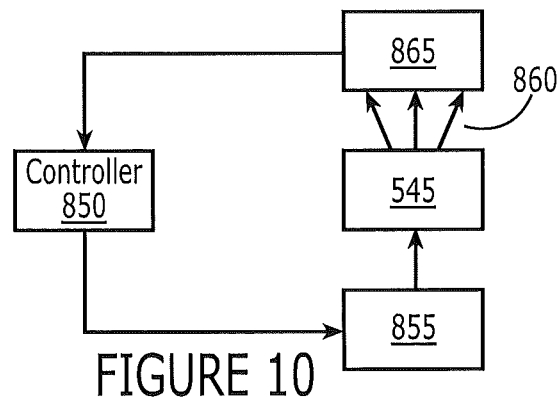
FIG. 10 is a schematic representation of an apparatus used to bin the singulated pre-formed optical conversion material caps in some embodiments according to the invention.

FIG. 10 is a block diagram illustrating a test apparatus for binning in some embodiments according to the invention. According to FIG. 10, the singulated pre-formed optical conversion material caps 545 are subjected to light 860 from an emitter 855 which impinges upon a detector 865. The detector 865 provides a signal to a controller 850 which determines test results representing, for example, the wavelength of the emitted light 860 provided by the singulated pre-formed optical conversion material cap 545. The controller 850 then determines which bin the singulated pre-formed optical conversion material cap 545 should be placed in. During a subsequent assembly process, the caps 545 can be selected from among the different bins based on the characteristic light emitted from the light emitting structure on which the cap is to be placed. Therefore, different light characteristics can be provided by mounting different caps onto common light emitting device structures.

Figure 11:
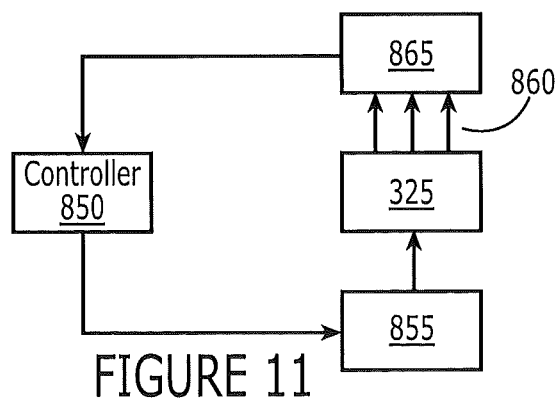
FIG. 11 is a schematic representation of pre-formed optical conversion material caps while included in the unitary layer in some embodiments according to the invention.

FIG. 11 is a block diagram illustrating a test system of some embodiments according to the invention. In particular, FIG. 11 illustrates a test system where selected ones of the pre-formed optical conversion material caps located within the unitary layer 540 are tested. More particularly, selected ones of the caps can be tested while those caps are still included in the unitary layer 540. This approach may be used, for example, when the optical conversion material layer within the unitary layer 540 has relatively uniform light characteristics in different parts of the unitary layer 540. Accordingly, different caps in the unitary layer 540 may be predicted to emit light which is substantially the same as the tested caps 545.

In operation, the controller 850 can cause the light source 855 to project the light onto selected ones of the caps in the unitary layer 540 whereupon the emitted light 860 can be measured by the detector 865. Once the selected caps within the unitary layer 540 have been tested, the test results provided to the controller 850 may be used to determine which bin all of the caps in the unitary layer 540 may be placed. Once the proper bin has determined, the caps within the unitary layer 540 can be separated from one another, whereupon all of the caps from the unitary layer 540 can be placed in a determined bin. During the subsequent assembly process, selected caps can be mounted on light emitting structures for the completion of the light emitting device.

Figure 12:
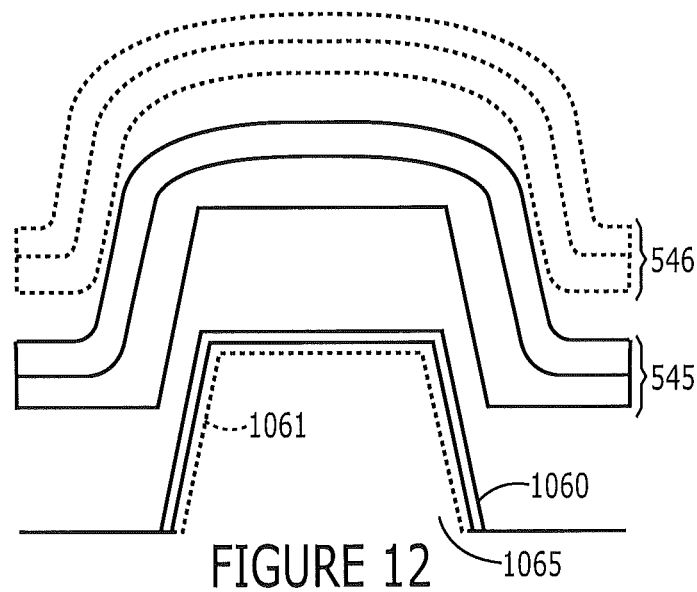
FIG. 12 is a cross-sectional view of a singulated pre-formed optical conversion material cap being mounted on a light emitting structure in some embodiments according to the invention.

FIG. 12 is a schematic cross-sectional view of a light emitting structure 1065 having an adhesion layer 1060 thereon. The singulated pre-formed optical conversion material cap 545 is selected from a bin and mounted onto the light emitting structure 1065 so that the adhesion layer 1060 promotes adhesion of the interior surfaces of the singulated pre-formed optical conversion material cap 545 to the lateral and upper surfaces of the light emitting structure 1065. It will be understood that the light emitting structure 1065 can be an LED flip-chip type arrangement which is free of wire-bonds on the lateral and upper surfaces of the light emitting structure 1065. In some embodiments according to the invention, the adhesion layer 1060 can be silicone. In some embodiments according to the invention, the adhesion layer 1060 can include an optical conversion material, such as those described herein. In some embodiments according to the invention, the adhesion layer 1060 can include an optical scattering material or feature such as those described herein.

As also illustrated in FIG. 12, in some embodiments according to the invention, an additional layer 1061 can be included on the light emitting structure 1065. In some embodiments according to the invention, the additional layer 1061 can be included between the light emitting structure 1065 and the adhesion layer 1060. In some embodiments according to the invention, the additional layer 1061 can include another optical conversion material, in addition to the optical conversion material included in the cap 545. In some embodiments according to the invention, the additional layer 1061 can include an optical scattering material or feature such as those described herein. In some embodiments according to the invention, the additional layer 1061 can be a spacer layer. It will be understood that the additional layer 1061 can include multiple features (such as a spacer, a filter, and a scattering material, etc.) or include multiple layers, which each layer provides one or more features of the additional layer 1061 described herein.

In some embodiments according to the invention, the additional layer 1061 can be a filter layer. In some embodiments according to the invention, the filter layer can be implemented as described in commonly assigned U.S. Patent Publication 2009/0236619, entitled Light Emitting Diodes With Light Filters, filed Mar. 19, 2008, the entire disclosure of which is incorporated herein by reference. In some embodiments according to the invention, the filter layer can be implemented as described in commonly assigned U.S. Pat. No. 7,901,111, entitled Lighting Device and Lighting Method, filed Nov. 29, 2007, the entire disclosure of which is incorporated herein by reference.

In some embodiments according to the invention, the adhesion layer 1060 can be relatively thin, which allows the cap 545 and the light emitting surface to substantially contact one another, even though the adhesion layer 1060 is an intervening layer. In some embodiments according to the invention, the adhesion layer 1060 is less than about 25 microns. In some embodiments according to the invention, the adhesion layer 1060 is less than about 10 microns. In some embodiments according to the invention, the adhesion layer 1060 is less than about 5 microns.

As further shown in FIG. 12, a second cap 546 can be placed over the cap 545. The second cap 546 may be formed in substantially the same way as the cap 545, but may be sized differently to allow for placement over the cap 545 rather than the device 1065. For example, the second cap 546 can be formed with a second mold to have an interior void that accommodates the cap 545. Accordingly, in some embodiments according to the invention, the second cap 546 can include an optical conversion material, which may be identical to that used to form the cap 545. In some embodiments according to the invention, the second cap 546 can include an optical conversion material that is different than that used to form the cap 545. For example, the cap 545 can include a red phosphor and the second cap 543 can include a yellow phosphor. In some embodiments according to the invention, another optical conversion material can be applied (such as by spraying) to the cap 545, rather than second cap 545.

Due to variations in manufacturing and/or the exclusion of certain chip features in the mold (e.g., surface roughness, light extraction features, and the like), in some embodiments according to the invention, areas of the devices can have thicker clear regions between the cap 545 and the light emitting surface to provide, for example, clearance for wire bonds or other features with complex geometry that may be included as part of the structure on which the cap 545 is to be mounted. These areas can be reduced, but still promote sufficient thermal heat sinking of the cap 545 to the chip, in order to reduce thermal effects on the optical conversion material in the cap 545. In some embodiments according to the invention, the cap 545 substantially contacts greater than about 60% of the upper and lateral surfaces of the light emitting surface. In other embodiments according to the invention, the cap 545 substantially contacts greater than about 80% of the upper and lateral surfaces of the light emitting surface. In still other embodiments according to the invention, the cap 545 substantially contacts greater than about 90% of the upper and lateral surfaces of the light emitting surface.

Figure 13A:
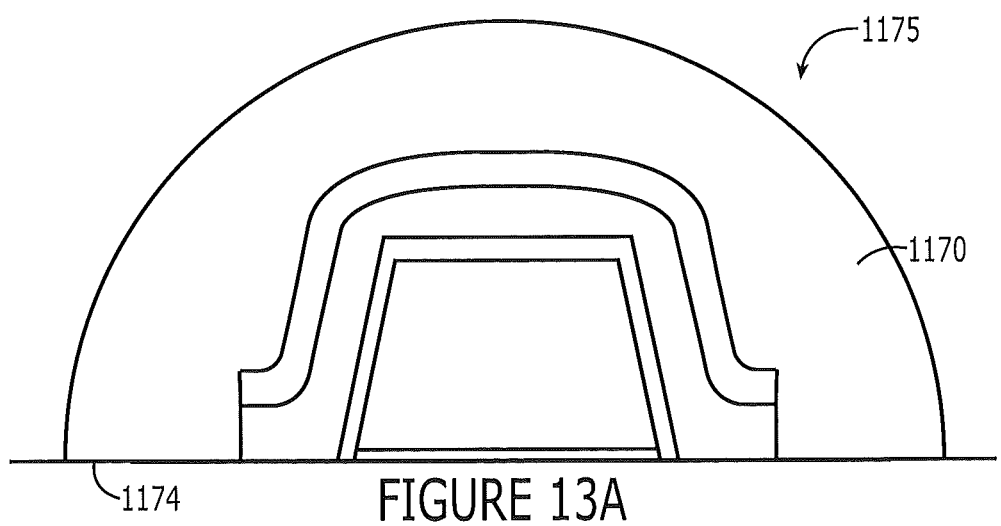
FIG. 13A is a schematic cross-sectional view of an encapsulate material covering the light emitting structure and singulated pre-formed optical conversion material cap mounted thereon to provide a light emitting device in some embodiments according to the invention.

FIG. 13A is a schematic cross-sectional view of a light emitting device 1175 including the light emitting structure 1065 having the singulated pre-formed optical conversion material cap 545 mounted thereon sealed within an encapsulate 1170 to provide the light emitting device 1175. In particular, the light emitting device 1175 shown in FIG. 13A has been assembled with the encapsulate 1170 and then placed on a surface 1174.

Figure 13B:
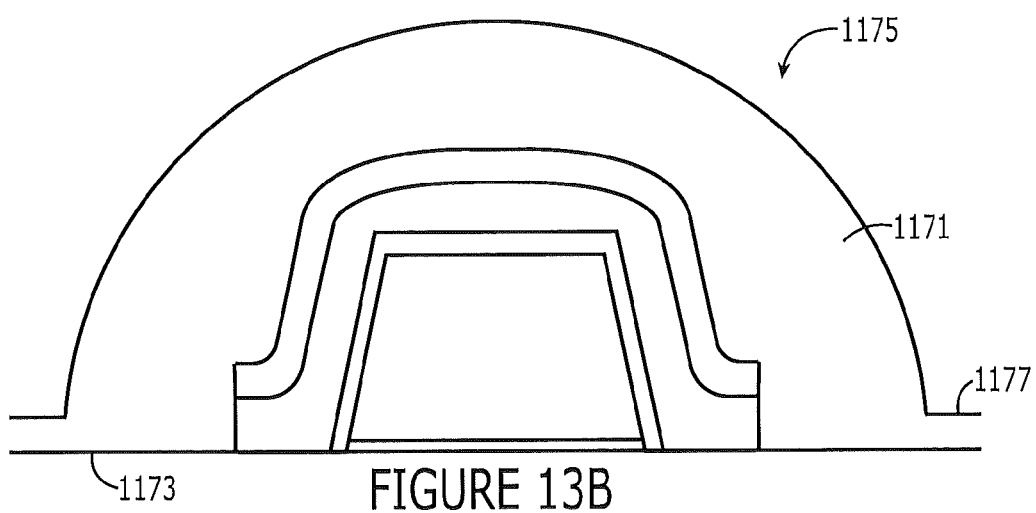
FIG. 13B is a schematic cross-sectional view of an encapsulate material covering the light emitting structure and singulated pre-formed optical conversion material cap mounted thereon to provide a light emitting device in some embodiments according to the invention.

FIG. 13B is a schematic cross-sectional view of a light emitting device 1176 including the light emitting structure 1065 having the singulated pre-formed optical conversion material cap 545 mounted thereon sealed within an encapsulate 1171 to provide the light emitting device 1176. In particular, the light emitting device 1176 shown in FIG. 13B has been placed on a surface 1173 and then assembled with the encapsulate 1171. Accordingly, the formation of the encapsulate 1171 extends to the surface 1173 in the form of what is sometimes referred to as a planar flash layer 1177, which can extend to the edge of the package enclosing the device 1176.

Figure 14:
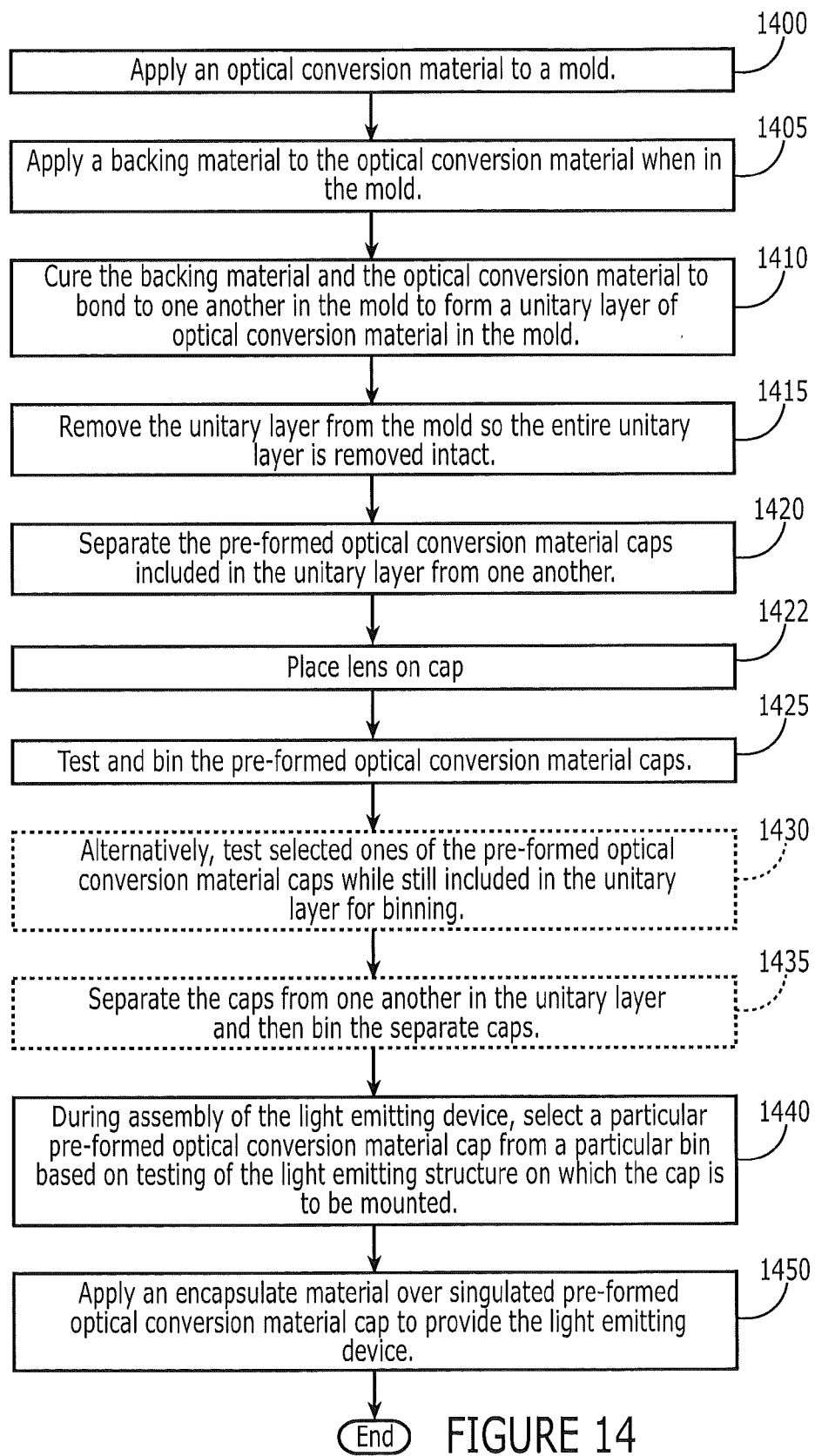
FIG. 14 is a flowchart illustrating methods of forming light emitting devices including pre-formed optical conversion material caps in some embodiments according to the invention.

FIG. 14 is a flow chart that illustrates methods of forming light emitting devise in some embodiments according to the invention. A release material is applied to the surface of the mold 100 to promote the removal of the subsequently formed unitary layer. According to FIG. 14, an optical conversion material applied to a mold (Block 1400). The optical conversion material 320 may be applied to the surfaces of the mold 100 as a conformal layer. It will be understood that the optical conversion material 320 can be a phosphor or other luminescent material. In some embodiments according to the invention, the optical conversion material 320 can provide a single optical conversion material layer 325 that includes a single or multiple types of optical conversion materials. In other embodiments according to the invention, the optical conversion material 320 provides multiple optical conversion material layers where each of the layers can include single ones or multiple ones of the optical conversion materials 320.

A backing material 430 is applied to the optical conversion material when in the mold (Block 1405). The backing material 430 and the optical conversion material 320 can be cured so that the backing material 430 and the optical conversion material 320 bond to one another in the mold 100 to form a unitary layer 540 of optical conversion material 320 in the mold 100 (Block 1410). It will be understood that the backing material 430 can provide the backing material layer that is either conformal or planarized as part of the unitary layer 540.

The unitary layer 540 is removed from the mold 100 (Block 1415), so the entire unitary layer 540 is removed intact. The pre-formed optical conversion material caps 545 included in the unitary layer can be separated from one another (Block 1420). The lens 543 can be placed on the caps 545 (Block 1422). The caps 545 (with or without the lens 543) are tested for binning (Block 1425) or alternatively, selected ones of the pre-formed optical conversion material caps 545 (with or without the lens 543) can be tested while still included in the unitary layer 540 for binning (Block 1430), whereupon the caps 545 are separated from one another in the unitary layer 540 and then binned (with or without the lens 543) (Block 1435).

During assembly of the light emitting device 1175, a particular pre-formed optical conversion material cap 545 (with or without the lens 543) is selected from a particular bin based on testing of the light emitting structure on which the cap is to be mounted (Block 1440). An encapsulate material 1170 is applied over the singulated pre-formed optical conversion material cap (with or without the lens 543) to provide the light emitting device 1175 (Block 1450).

Figure 15:
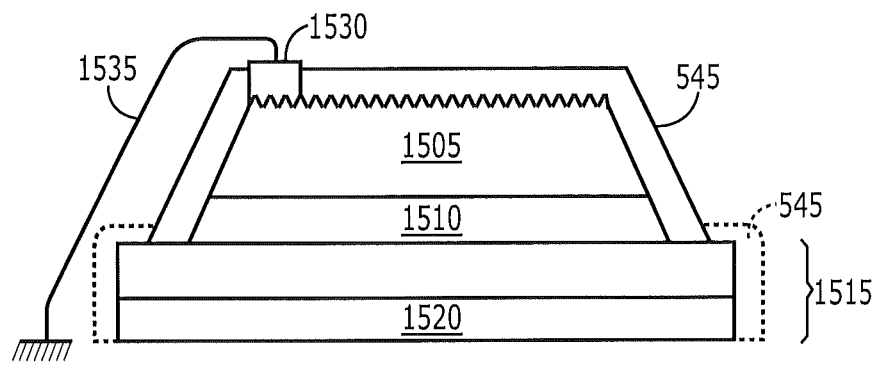
FIG. 15 is a schematic cross-sectional view of an exemplary light emitting device having a pre-formed optical conversion material cap mounted thereon in some embodiments according to the invention.

FIG. 15 is a schematic cross-sectional view of an exemplary light emitting device having a cap 545 mounted thereon in some embodiments according to the invention. According to FIG. 15, a p-type GaN layer 1510 is formed on a n-type GaN layer 1505, which is on a growth substrate. The p-type GaN layer 1510 is attached to a support structure 1515 including a substrate 1520. The growth substrate is removed to expose the n-type GaN layer 1505. A pre-formed optical conversion material cap 545 is placed over the exposed n-type GaN layer 1505 and on the lateral sidewalls of the n-type GaN layer 1505 and the p-type GaN layer 1510.

In some embodiments according to the invention, the pre-formed optical conversion material cap 545 extends beyond the lateral sidewalls of the n-type GaN layer 1505 and the p-type GaN layer 1510 to lateral sidewalls of the support structure 1515. The exposed n-type GaN layer 1505, the p-type GaN layer 1510, and the support structure 1515 including the substrate 1520, are describe further in, for example, commonly assigned U.S. Pat. No. 7,791,061, the disclosure of which is hereby incorporated herein by reference. As further shown in FIG. 15, the n-type GaN layer 1505 can have a roughened upper surface (or other include other light extraction features such as etched optical feature, crystallographic faceted pyramids, etc.) covered by the cap 545.

In some embodiments according to the invention, a contact 1530 can be included on the n-type GaN layer 1505, which is bonded to a wire 1535. In some embodiments according to the invention, the contact 1530 is formed on the p-type GaN layer 1510. In such embodiments according to the invention, it will be understood that the light emitting device can be formed to allow that cap 545 to be placed over the device despite the presence of the wire 1535 and the contact 1530. In some embodiments according to the invention, the cap 545 is placed on the device after the wire 535 is bonded to the contact 1530. In some embodiments according to the invention, the cap 545 is placed on the device before the wire 535 is bonded to the contact 1530.

Figure 16:
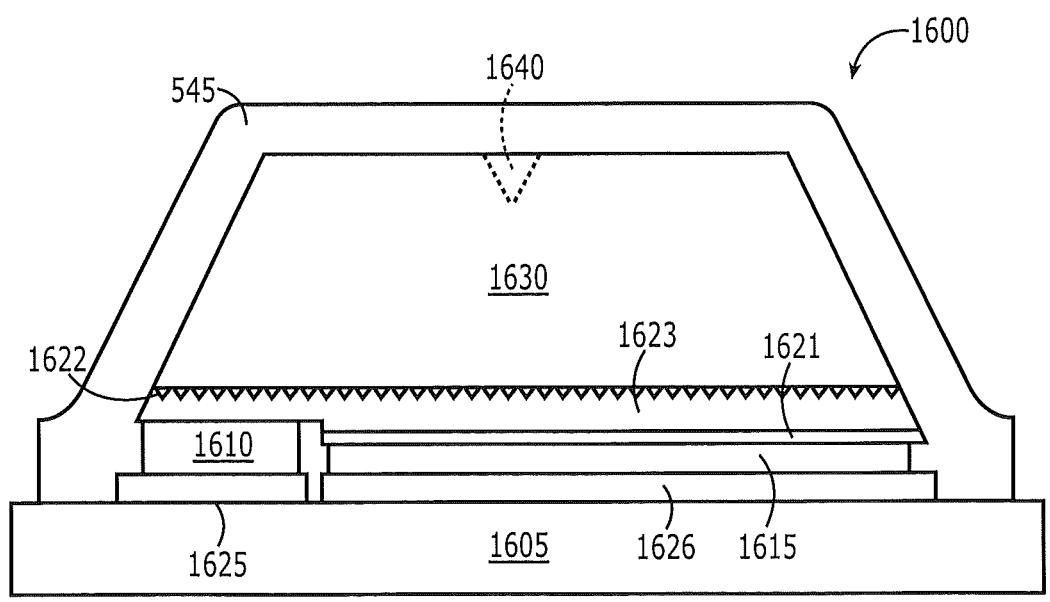
FIG. 16 is a schematic cross-sectional view of an exemplary light emitting device having a pre-formed optical conversion material cap mounted thereon in some embodiments according to the invention.

FIG. 16 is a schematic cross-sectional view of an exemplary light emitting device 1600 having a cap 545 mounted thereon in some embodiments according to the invention. According to FIG. 16, the light emitting device 1600 includes an optically transparent growth substrate 1630, which can include a patterned surface 1622, formed on the transparent growth substrate 1630 prior to epitaxial growth of an n-GaN layer 1623 thereon. A p-GaN layer 1621 can be formed on a portion of the n-GaN layer 1623.

Anode and cathode contacts 1610 and 1615 are electrically connected to the n-GaN layer 1623 and to the p-GaN layer 1621, respectively. The anode and cathode contacts 1610 and 1615 can be coupled to respective conductive traces 1625 and 1626, provided on a mounting substrate 1605, to provide external connections for the light emitting device 1600. As further shown in FIG. 16, no wirebonds are connected to the upper surfaces of the device 1600. It will be understood that other elements may be included in complete devices, which may be eliminated from this description for the purposes of illustration only. The exemplary direct attach flip-chip configuration shown in FIG. 16 is described further in, for example, commonly assigned U.S. Patent Publication 2009/0283787, the entire disclosure of which is incorporated herein by reference.

Figure 17:
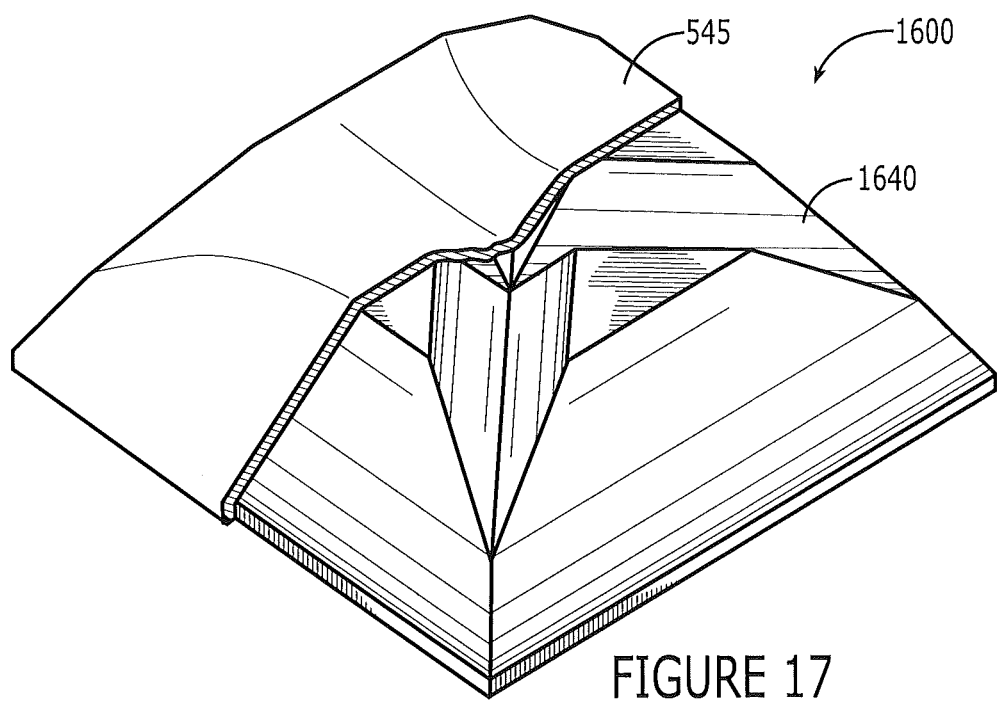
FIG. 17 is a schematic perspective view of an exemplary light emitting device having a portion of the pre-formed optical conversion material cap removed from the device to show grooves in an upper surface of the device.

As further shown in FIG. 16, grooves 1640 can be formed in the upper surface of the device 1600. In some embodiments according to the invention, the cap 545 is formed to occupy at least a portion of the grooves 1640. In some embodiments according to the invention, the cap 545 is formed to be absent from the grooves 1640, which may allow for the presence of other materials to be present in the grooves 1640. Accordingly, the grooves 1640 may provide areas of the devices that have thicker clear regions between the cap 545 and the light emitting surface to provide, for example, clearance for wire bonds or other features with complex geometry that may be included as part of the structure on which the cap 545 is to be mounted. FIG. 17 illustrates a perspective view of the device 1600 having a portion of the cap 545 removed from the device to show the grooves 1640.

It will be understood that the embodiments illustrated in the Figures showing the inclusion of the cap 545 are not an exhaustive enumeration of the different shapes and configurations of devices with which the cap 545 may be used. For example, in some embodiments according to the invention, a cap 545 may be included on device configurations that are sometimes referred to as a vertical light emitting diode, a lateral light emitting diode, etc). In some embodiments according to the invention, the substrate can be silicon carbide or sapphire. In some embodiments according to the invention, the cap 545 can be included on a device having wirebonds.

It will be understood that, although the terms first, second, etc, may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed:

1. A method of forming comprising:
applying an optical conversion material to a non-planar optical conversion material mold to form a unitary layer including a non-planar optical conversion material layer;
applying a backing material to the optical conversion material when in the mold; and
removing the non-planar optical conversion material layer from the mold.

2. The method of claim 1, wherein applying comprises applying the optical conversion material to the non planar optical conversion material mold to provide a plurality of pre formed non-planar conformal optical conversion material caps that are more closely spaced together on the mold than are devices on which the pre formed optical conversion material caps are to be mounted.

3. The method of claim 1 wherein applying comprises applying the optical conversion material to the non-planar optical conversion material mold to provide a plurality of pre-formed non-planar conformal optical conversion material caps configured to cover upper surfaces and side surfaces of devices on which the caps are to be mounted.

4. A method of forming comprising:
applying an optical conversion material to a non-planar surface of a mold to form a unitary layer including a non-planar optical conversion material layer;
applying a backing material to the optical conversion material when in the mold; and
removing the non-planar optical conversion material layer from the mold.

5. The method of claim 4, wherein applying comprises applying the optical conversion material to the non planar surface of the mold to provide a plurality of pre formed non planar conformal optical conversion material caps that are more closely spaced together on the mold than are devices on which the pre formed non planar conformal optical conversion material caps are to be mounted.

6. The method of claim 4 wherein applying comprises applying the optical conversion material to the non-planar surface of the mold to provide a plurality of pre-formed non-planar conformal optical conversion material caps configured to cover upper surfaces and side surfaces of devices on which the caps are to be mounted.

7. A method of forming comprising:
applying an optical conversion material to a mold to form a unitary layer of non-planar conformal optical conversion material thereon;
applying a backing material to the optical conversion material when in the mold; and
removing the unitary layer of non planar conformal optical conversion material from the mold.

8. The method of claim 7, wherein applying comprises applying the optical conversion material to the mold to provide a plurality of pre formed non-planar conformal optical conversion material caps that are more closely spaced together on the mold than are devices on which the pre formed non-planar optical conversion material caps are to be mounted.

9. The method of claim 7 wherein applying comprises applying the optical conversion material to the mold to provide a plurality of pre-formed non-planar conformal optical conversion material caps configured to cover upper surfaces and side surfaces of devices on which the caps are to be placed.

10. The method of claim 7, wherein structures in the mold are spaced apart from one another by a first pitch that is approximately 100 microns.

11. The method of claim 10 further comprising:
singulating the unitary layer of non-planar conformal optical conversion material to provide a plurality of pre-formed non-planar conformal optical conversion material caps for placement onto the devices.

12. A method of forming comprising:
applying an optical conversion material to structures in a mold that are spaced apart from one another in the mold by a first spacing to form a unitary layer comprising the optical conversion material to provide a plurality of pre-formed optical conversion material caps, wherein each of the plurality of pre-formed optical conversion material caps is configured to be mounted on a respective light emitting device;
applying a backing material to the optical conversion material when in the mold; and
removing the unitary layer of optical conversion material from the mold.

13. The method of claim 12 wherein the backing material comprises an optically clear silicone material.

14. The method of claim 12 wherein the optical conversion material comprises phosphor.

15. The method of claim 12 wherein the optical conversion material comprises a combination of different phosphors.

16. The method of claim 12 wherein applying the optical conversion material comprises applying a first optical conversion material, the method further comprising:
applying a second optical conversion material on the first optical conversion material to form the unitary layer of optical conversion material including the first and second optical conversion materials in respective separate first and second layers of the unitary layer of optical conversion material.

17. The method of claim 12 wherein applying the backing material to the optical conversion material when in the mold comprises applying a conformal backing material to the optical conversion material when in the mold to provide the unitary layer of optical conversion material.

18. The method of claim 12 wherein applying the backing material to the optical conversion material when in the mold comprises applying a planarized backing material to the optical conversion material when in the mold to provide the unitary layer of optical conversion material.

19. The method of claim 12 wherein the backing material provides a backing layer, wherein the backing layer and the optical conversion material layer comprise separate layers integrated with one another.

20. The method of claim 12 wherein the backing material provides a backing layer, wherein the backing layer and the optical conversion material comprise different materials.

21. The method of claim 12 wherein applying comprises applying the optical conversion material to the mold to form the unitary layer having a non-planar surface of optical conversion material thereon.

22. The method of claim 12 wherein applying the optical conversion material to the mold comprises heating the mold while applying the optical conversion material to the mold.

23. The method of claim 12 wherein the optical conversion material comprises a plurality of optical conversion materials configured to emit light at different wavelengths.

24. The method claim 12 wherein applying the optical conversion material to the mold comprises applying a first optical conversion material to the mold, the method further comprising:
applying a second optical conversion material on the first optical conversion material to form the unitary layer of optical conversion material.

25. The method of claim 12 wherein the backing material provides a backing layer, wherein the backing layer and the optical conversion material layer comprise separate layers bonded together with one another.

26. The method of claim 12 wherein the backing material provides a backing layer, wherein the backing layer and the optical conversion material layer comprise separate layers chemically or covalently bonded together with one another.

27. The method of claim 12 wherein the backing material provides a backing layer bonded with the optical conversion material in the mold, the method further comprising:
forming optical features on an upper surface of the backing layer.

28. The method of claim 27 wherein the optical features comprise microlenses.

29. The method of claim 12 further comprising:
curing the backing material to form a backing layer bonded with the optical conversion material in the mold.

30. The method of claim 29 wherein the backing layer has a complex shear modulus (G*) of about 12 MPA to about 16 MPA at about 25 degrees Centigrade.

31. The method of claim 29 wherein the mold comprises structures having profiles representing the light emitting devices on which the pre formed optical conversion material caps are to be mounted.

32. The method of claim 29 further comprising:
separating the plurality of pre-formed optical conversion material caps after removing the unitary layer from the mold to provide singulated pre-formed optical conversion material caps.

33. The method of claim 29 further comprising:
separating the plurality of pre-formed optical conversion material caps in the unitary layer from one another when in mold, to provide singulated pre-formed optical conversion material caps.

34. The method of claim 29 further comprising:
separating the plurality of pre-formed optical conversion material caps in the unitary layer from one another to provide singulated pre-formed optical conversion material caps.

35. The method of claim 34 further comprising:

testing the singulated pre-formed optical conversion material caps to provide respective test results to determine respective bins into which the singulated pre-formed optical conversion material caps are organized; and placing the singulated pre-formed optical conversion material caps in the respective bins based on the respective test results.

36. The method of claim 29 further comprising:

testing ones of the plurality of pre-formed optical conversion material caps when included in the unitary layer to provide respective test results to determine a respective bin into which the plurality of pre-formed optical conversion material caps are organized; and then separating the plurality of pre-formed optical conversion material caps in the unitary layer from one another to provide singulated pre-formed optical conversion material caps; and placing the singulated pre-formed optical conversion material caps in the respective bin based on the respective test results.

37. The method of claim 36 further comprising:

applying an adhesion layer to respective devices;

mounting ones of the singulated pre-formed optical conversion material caps on the respective devices; and encapsulating the respective devices to provide a plurality of light emitting devices.

\* \* \* \* \*

UNITED STATES PATENT AND TRADEMARK OFFICE
CERTIFICATE OF CORRECTION

PATENT NO.        : 9,444,024 B2
APPLICATION NO.   : 13/293475
DATED             : September 13, 2016
INVENTOR(S)       : Donofrio et al.

It is certified that error appears in the above-identified patent and that said Letters Patent is hereby corrected as shown below:

In the Claims
Column 18, Claim 2, Line 35: Please correct "non planar" to read -- non-planar --
Column 18, Claim 2, Line 37: Please correct "pre formed" to read -- pre-formed --
Column 18, Claim 2, Line 39: Please correct "pre formed" to read -- pre-formed --
Column 18, Claim 5, Line 56: Please correct "non planar" to read -- non-planar --
Column 18, Claim 5, Lines 57 and 58: Please correct "pre formed non planar" to read -- pre-formed non-planar --
Column 18, Claim 5, Line 60: Please correct "pre formed non planar" to read -- pre-formed non-planar --
Column 19, Claim 7, Line 7: Please correct "non planar" to read -- non-planar --
Column 19, Claim 8, Line 11: Please correct "pre formed" to read -- pre-formed --
Column 19, Claim 8, Line 14: Please correct "pre formed" to read -- pre-formed --
Column 20, Claim 24, Line 20: Please correct "method claim" to read -- method of claim --
Column 20, Claim 31, Line 51: Please correct "pre formed" to read -- pre-formed --

Signed and Sealed this
Second Day of May, 2017

Michelle K. Lee
*Director of the United States Patent and Trademark Office*